(12) United States Patent
Kataoka et al.

(10) Patent No.: US 6,414,236 B1
(45) Date of Patent: Jul. 2, 2002

(54) SOLAR CELL MODULE

(75) Inventors: Ichiro Kataoka, Kyotanabe; Satoru Yamada, Nara; Hidenori Shiotsuka, Kyotanabe; Hideaki Zenko, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/605,754

(22) Filed: Jun. 28, 2000

(30) Foreign Application Priority Data

Jun. 30, 1999 (JP) .............................................. 11-184860

(51) Int. Cl.⁷ .......................................... H01L 31/048
(52) U.S. Cl. ..................... 136/251; 136/244; 136/258; 136/256; 257/433; 257/434
(58) Field of Search ................................ 136/251, 244, 136/258 PC, 258 AM, 256; 257/433, 434

(56) References Cited

U.S. PATENT DOCUMENTS

| | | | | |
|---|---|---|---|---|
| 3,957,537 A | * | 5/1976 | Baskett et al. | 136/251 |
| 4,451,598 A | | 5/1984 | Decroix | 524/69 |
| 4,636,578 A | * | 1/1987 | Feinberg | 136/251 |
| 4,729,970 A | | 3/1988 | Nath et al. | 438/4 |
| 5,578,141 A | | 11/1996 | Mori et al. | 136/251 |
| 5,660,646 A | | 8/1997 | Kataoka et al. | 136/251 |
| 5,684,325 A | * | 11/1997 | Kataoka et al. | 257/433 |
| 5,718,772 A | | 2/1998 | Mori et al. | 136/251 |
| 5,973,258 A | | 10/1999 | Shiotsuka et al. | 136/252 |
| 6,034,323 A | | 3/2000 | Yamada et al. | 136/259 |

FOREIGN PATENT DOCUMENTS

| | | | |
|---|---|---|---|
| EP | 0 755 080 | | 1/1997 |
| EP | 0 922 730 | | 6/1999 |
| JP | 04-325531 A | * | 11/1992 |
| JP | 6-35575 | | 5/1994 |
| JP | 7-202236 | | 8/1995 |
| JP | 7-302926 | | 11/1995 |
| JP | 9-36405 | | 2/1997 |

OTHER PUBLICATIONS

Patent Abstracts of Japan, vol. 1995, No. 11, Dec. 26, 1995 (corresponds to JP 7–202236).
Patent Abstracts of Japan, vol. 010, No. 094 (C–338), Apr. 11, 1986 (corresponds to JP 60–226589).

* cited by examiner

*Primary Examiner*—Alan Diamond
(74) *Attorney, Agent, or Firm*—Fitzpatrick, Cella, Harper & Scinto

(57) ABSTRACT

A solar cell module comprises a photovoltaic element, the light-receiving surface and/or non-light-receiving surface of a photovoltaic element being sealed by organic polymeric resin layers, wherein when at least one of the organic polymeric resin layers contains a specific ethylene-unsaturated fatty acid ester-unsaturated fatty acid terpolymer, thereby providing a solar cell module which has excellent weather resistance, heat resistance and moisture resistance and an excellent photoelectric conversion and which can maintain stable solar cell performance over a long period of time.

19 Claims, 2 Drawing Sheets

SOLAR CELL MODULE

BACKGROUND OF THE INVENTION

1. Field of the Invention

The present invention relates to a solar cell module, and particularly to a solar cell module in which the light-receiving surface and/or non-light-receiving surface of a photovoltaic element are/is sealed by an organic polymeric resin.

2. Related Background Art

In recent years, there has been growing awareness of ecological problems all over the world. In particular, a severe concern has been rising over the earth-warming phenomenon caused by the emission of $CO_2$, and the demand for clean energy has been further increasing. It can be said at present that a solar cell is a promising clean energy source because it is safe and easy to handle.

FIG. 5 is a schematic cross-sectional view showing the basic structure of a solar cell module. In FIG. 5, numeral 501 denotes a photovoltaic element, 502 a sealer resin, 503 a front surface member, and 504 a back surface member. Sunlight is incident upon the light-receiving surface of the photovoltaic element 501 by penetrating the front surface member 503 and the sealer resin 502 and converted into electric energy. Electricity generated is outputted from output terminals (not shown).

The photovoltaic element cannot withstand being directly used under a severe outdoor condition, because the photovoltaic element itself is susceptible to corrosion and easily broken by a shock from an external source. Therefore, the photovoltaic element must be covered and protected by a covering material. The most generally, this is done by a method in which the photovoltaic element is sandwiched and laminated between a transparent front surface member having weather resistance, such as glass and a fluorocarbon resin film, and a back surface member having excellent moisture resistance and electrical resistance properties, such as an aluminum-laminated teddler film and a polyester film.

As a conventional sealer resin for the solar cell, polyvinyl butyral and an ethylene-vinyl acetate copolymer (EVA) have been mainly used. Of these, the crosslinkable composition of an EVA has excellent properties such as heat resistance, weather resistance, transparency and cost efficiency and is the most popular sealer resin for the solar cell at present.

The solar cell module is required to have high degree of durability because It is used outside over a long period of time. To say nothing of the durability of the photovoltaic element itself, the covering material is also required to have excellent weather resistance and heat resistance. However, the yellowing of the sealing material or peeling between members may become evident by the light or heat degradation of the covering material when the module is exposed to the outdoors over 10 years. The yellowing of the sealing material induces a decrease in the amount of incident light and lower an electric output. Meanwhile, peeling between members allows moisture to enter the peeled portion, thereby inducing the corrosion of the photovoltaic element itself or metal members attached to the element, with the result of lowering the performance of the solar cell.

Although the conventionally employed EVA is an excellent sealing material as described above, it is gradually degraded by hydrolysis or pyrolysis. That is, the EVA essentially has such a characteristic that acetic acid is easily liberated therefrom. The liberation of acetic acid occurs due to heat or moisture, thereby causing the yellowing of the sealing material or lowering the mechanical strength or adhesive strength of the sealing material. Furthermore, the liberated acetic acid serves as a catalyst to further promote the degradation. Meanwhile, there is also the problem that the photovoltaic element itself or various metal members attached to the element such as electrodes are corroded by acetic acid.

To solve such problems, a sealing material for the solar cell which has higher degree of durability than its conventional counterparts has been proposed. Japanese Patent Application Laid-Open No. 7-302926 discloses that by using a copolymer resin of ethylene and an unsaturated fatty acid ester as a sealing material, heat resistance and moisture resistance can be improved and degradation in the performance of the photovoltaic element due to the liberation of acid can be inhibited. In particular, the above application discloses that by using the copolymer resin of ethylene and an unsaturated fatty acid ester as a sealing material to a photovoltaic element having a thin semiconductor film and a transparent conductive layer formed on a conductive metal substrate, a short circuit in the element and the corrosion of the transparent conductive layer by an acid can be prevented and a highly reliable solar cell module can be provided.

Further, Japanese Patent Application Laid-Open No. 7-202236 discloses that as the adhesive layer, there can be used an ionomer resin, an ethylene-ethyl acrylate copolymer (EEA) resin, an ethylene-methacrylic acid random copolymer (EMAA) resin, an ethylene-acrylic acid copolymer (EAA) resin, an ethylene-methyl methacrylate copolymer (EMMA) resin, an ethylene-methyl acrylate copolymer (EMA) resin and other adhesive polyolefin resins.

However, the copolymer resin of ethylene and an unsaturated fatty acid ester essentially has low adhesion to metals, glass and other plastic materials, and when it is used as a sealing material for the solar cell module, it is liable to peel off from the element, the front surface member or the back surface member. To overcome such inconvenience, it has been heretofore practiced that an adhesion-improving agent is added to the sealer resin or that the sealer resin is subjected to an easy-adhesion treatment. To state more specifically, the addition of a silane coupling agent or an organic titanate compound to the sealer resin is disclosed in Japanese Patent Publication No. 6-35575 and Japanese Patent Application Laid-Open No. 9-36405, while the treatment of the surface of the front surface member which is in contact with the sealer resin with corona, plasma, ozone, ultraviolet, electron-beam radiation or flame when the front surface member is a film is disclosed in Japanese Patent Application Laid-Open No. 9-36405.

However, the silane coupling agent and the organic titanate compound are susceptible to hydrolysis. Therefore, when a sealer resin to which these have been added in advance is formed into a sheet and thermally crimped to produce a solar cell module, the silane coupling agent or organic titanate compound contained in the sheet reacts with moisture in the air and gradually loses activity during the storage of the sheet, whereby the effect of improving adhesion is liable to be insufficient. Further, when the solar cell module is exposed to the outdoors, the silane coupling agent or organic titanate compound which maintains adhesion among the members is gradually decomposed and loses adhesive strength under the influence of light, heat or moisture. On the other hand, the surface treatment with corona, plasma or the like, generates functional groups on the inactive film surface and forms mainly hydrogen bonds between the film and the sealer resin to improve adhesive strength, but the surface treatment fails to provide a satisfactory effect when the resin substantially lacks adhesion due to such reasons as the lack of polar groups in the sealer resin.

Meanwhile, the copolymer resin of ethylene and an unsaturated fatty acid provides higher adhesion but insufficient thermal stability. Recently, a building material combination type solar cell module, which is obtained by applying a photovoltaic element directly to a building material, is under rapid development, as a solar cell module for electric power which is mounted on the roof or wall of a house, because it is advantageous in view of appearance, applicability and costs. Since less air pass under such a module than a conventional mounted-on-a-base type module, the temperature of the module is elevated to 80° C. or higher. At such a high temperature, the copolymer resin of ethylene and an unsaturated fatty acid is gradually decomposed, and yellowing and peeling occur.

SUMMARY OF THE INVENTION

It is the object of the present invention to minimize the degradation of the performance of a solar cell during its long-time exposure to the outdoors, especially under high-temperature and high-humidity conditions, by providing a sealer resin for a solar cell module which is excellent in weather resistance, heat resistance and light permeability, poor in water absorption properties, free from the liberation of acid even in the presence of moisture and excellent in adhesion to a various base members, so as to overcome the above problems.

The present inventors have made intensive studies to solve the above problems and found that the following method is the most effective.

That is, in a solar cell module in which the light-receiving surface and/or non-light-receiving surface of a photovoltaic element is sealed by organic polymeric resin layers, at least one of the organic polymeric resin layers comprises an ethylene-unsaturated fatty acid ester-unsaturated fatty acid terpolymer as a main component.

DETAILED DESCRIPTION OF THE PREFERRED EMBODIMENTS

Figure 1:
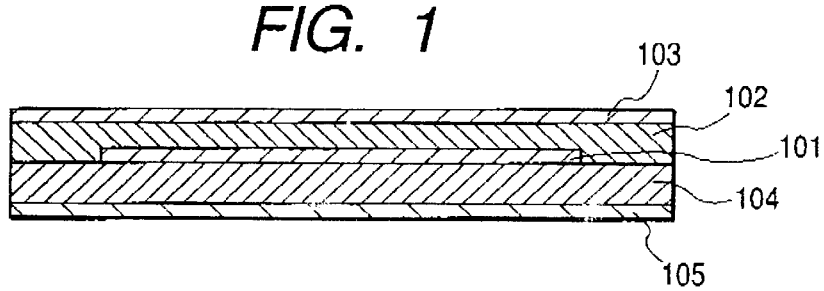
FIG. 1 is a schematic cross-sectional view of a solar cell module according to the present invention.

According to the present invention, the following effects can be expected.

A solar cell module having excellent weather resistance, heat resistance and moisture resistance can be provided. That is, because the substantial adhesion of the sealing material is improved, peeling does not occur even when the module is exposed to the outdoors over a long period of time. Further, since the sealing material does not decompose under high-temperature and high-moisture conditions to allow acid to liberate therefrom, weather resistance is improved, and since no corrosion of the photovoltaic element by acid occurs, the stable performance of the solar cell can be maintained over a long period of time.

Further, when the above terpolymer is an ethylene-acrylic ester-acrylic acid terpolymer, an ethylene-acrylic ester-maleic anhydride terpolymer, an ethylene-methacrylic ester-acrylic acid terpolymer, an ethylene-acrylic ester-methacrylic acid terpolymer, an ethylene-methacrylic ester-methacrylic acid terpolymer, an ethylene-methacrylic ester-maleic anhydride terpolymer or a mixture thereof, there can be obtained a sealing material whose weather resistance, heat resistance and moisture resistance are well balanced and which has excellent light permeability, whereby an extremely excellent solar cell module can be provided.

As for the content of each constituent of the above terpolymer, the content of ethylene is preferably 65 to 89.9% by weight, the content of an unsaturated fatty acid ester is preferably 10 to 30% by weight, and the content of an unsaturated fatty acid is preferably 0.1 to 5.0% by weight. This allows the sealing material to have particularly excellent adhesion without impairing weather resistance, heat resistance and moisture resistance.

The above terpolymer has a bicut softening point of not less than 40° C., whereby the sealing material does not undergo creeping even when the module is exposed to high temperatures during its actual use. Further, the above terpolymer also has a bicut softening point of not more than 110° C., whereby a solar cell module can be easily produced by conventional thermal crimping in the production process.

The above terpolymer contains a hindered amine light stabilizer, whereby weather resistance is improved. That is, the yellowing or decomposition of the sealing material exposed to the outdoors over a long period of time can be inhibited.

The above terpolymer contains an ultraviolet absorber, whereby weather resistance (light resistance) is improved. Further, the degradation of members coated with the sealing material by ultraviolet light can be inhibited.

The above ultraviolet absorber is selected from the derivatives of benzophenone or benzotriazole, whereby the weather resistance of the sealing material can be improved while a decrease in the output of a solar cell is kept at the lowest level. That is, no visible light that is necessary for the generation of electric power for the solar cell is absorbed, and only ultraviolet light can be selectively absorbed.

The above terpolymer contains a silane coupling agent, whereby adhesion to inorganic materials is further improved.

The above terpolymer contains a hindered phenol antioxidant, whereby heat resistance is improved.

The above terpolymer has a total light permeability of 90% or more over a wavelength range of 400 to 1,000 nm when having a thickness of 0.5 mm, whereby a decrease in the output of the solar cell caused by the optical loss of the sealing material can be minimized.

The above acrylic ester is methyl acrylate, ethyl acrylate or (iso)butyl acrylate and the above methacrylic ester is methyl methacrylate, ethyl methacrylate or (iso)butyl methacrylate, whereby the resin can be produced at low cost. Thus, the module cost can be kept low.

The above photovoltaic element has on a conductive substrate as a first electrode a semiconductor photoactive layer which is a light-convert member, and a transparent conductive layer as a second electrode formed thereon, whereby it is possible to obtain the maximum of the effect of the sealing material of the present invention. That is, a highly reliable module having neither the short-circuit nor the corrosion of the element during its long-time exposure to the outdoors can be provided.

The above conductive substrate is made of stainless steel, whereby the adhesive strength of the sealing material to the substrate can be improved.

The short-circulated portion of the above photovoltaic element is repaired by a defect removing treatment the element and has a shunt resistance of 1 to 500 k$\Omega \cdot$cm$^2$, thereby obtaining the maximum of the sealing material of the present invention. That is, there no longer occurs the degradation of the performance of the solar cell caused by recurrence of a short circuit at the portion where a short circuit has occurred and repaired once.

A collecting electrode which contains copper or silver as one of its constituents is formed on the light-receiving surface of the above photovoltaic element and the above terpolymer is placed in contact with the collecting electrode, whereby there no longer occurs the degradation of the performance of the solar cell caused by the corrosion of the collecting electrode by acid.

The light-receiving surface of the above photovoltaic element is covered with the above terpolymer and then a thin fluoride polymer film is stacked thereon, as the outermost layer, whereby a light and flexible solar cell module having excellent weather resistance, heat resistance and moisture resistance can be obtained. That is, a highly reliable module can be provided since the sealing material is not decomposed by moisture in spite of the high moisture permeability of the thin fluoride polymer film.

The above photovoltaic element is bonded to a building material via an adhesive layer, whereby there can be solved the problem of the degradation of the sealing material at high temperatures, which is a conventional problem associated with a building material combination type module.

The solar cell module has the highest operating temperature of 80° C. or higher, whereby the heat resistance-improving effect of the sealing material of the present invention can be effectively obtained.

FIG. 1 is a schematic cross-sectional view of one example of a solar cell module according to the present invention. In FIG. 1, reference numeral 101 denotes a photovoltaic element, 102 a front surface sealing material, 103 a front surface member, 104 a back surface sealing material, and 105 a back surface member.

The sealing materials 102 and 104 in the present invention will be described in detail hereinafter.

The front surface sealing material 102 is required to protect the photovoltaic element from exposure to the outdoors by covering the unevenness of the light-receiving surface of the element with the resin. Further, it also serves to bond the front surface member 103 to the element. Therefore, it is required to have weather resistance, adhesion and heat resistance in addition to high transparency. Further, it must meet such requirements as low water absorption properties and no liberation of acid, which are the principal objectives of the present invention. To meet such requirements, it is appropriate that it contains, as its main component, an ethylene-acrylic ester-acrylic acid terpolymer, an ethylene-acrylic ester-maleic anhydride terpolymer, an ethylene-methacrylic ester-acrylic acid terpolymer, ethylene-acrylic ester-methacrylic acid terpolymer, an ethylene-methacrylic ester-methacrylic acid terpolymer, an ethylene-methacrylic ester-maleic anhydride terpolymer or a mixture thereof.

The acrylic ester and the methacrylic ester include, for example, methyl acrylate, methyl methacrylate, ethyl acrylate, ethyl methacrylate, (iso)propyl acrylate, (iso)propyl methacrylate, (iso)butyl acrylate, (iso)butyl methacrylate, hexyl acrylate, hexyl methacrylate, octyl acrylate, octyl methacrylate, lauryl acrylate, lauryl methacrylate, benzyl acrylate and benzyl methacrylate. Of these, methyl acrylate, methyl methacrylate, ethyl acrylate, ethyl methacrylate, (iso)butyl acrylate and (iso)butyl methacrylate are particularly preferable.

Examples of the terpolymer are an ethylene-methyl acrylate-acrylic acid terpolymer, an ethylene-methyl methacrylate-acrylic acid terpolymer, an ethylene-methyl acrylate-methacrylic acid terpolymer, an ethylene-methyl methacrylate-methacrylic acid terpolymer, an ethylene-ethyl acrylate-acrylic acid terpolymer, an ethylene-ethyl methacrylate-acrylic acid terpolymer, an ethylene-ethyl acrylate-methacrylic acid terpolymer, an ethylene-ethyl methacrylate-methacrylic acid terpolymer, an ethylene-isobutyl acrylate-acrylic acid terpolymer, an ethylene-isobutyl acrylate-methacrylic acid terpolymer, an ethylene-isobutyl methacrylate-methacrylic acid terpolymer, an ethylene-methyl acrylate-maleic anhydride terpolymer, an ethylene-methyl methacrylate-maleic anhydride terpolymer, an ethylene-ethyl acrylate-maleic anhydride terpolymer and an ethylene-ethyl methacrylate-maleic anhydride terpolymer, all of which can be used as a suitable material.

Of these terpolymers, the ethylene-methyl acrylate-maleic anhydride terpolymer, the ethylene-ethyl acrylate-maleic anhydride terpolymer and the ethylene-isobutyl acrylate-methacrylic acid terpolymer are preferable in view of availability and cost efficiency, and the ethylene-methyl acrylate-maleic anhydride terpolymer and the ethylene-isobutyl acrylate-methacrylic acid terpolymer are the most preferable, particularly in view of compatibility between transparency and adhesion.

Further, the content of ethylene in the terpolymer is 65 to 89.9% by weight, the content of the unsaturated fatty acid ester is 10 to 30% by weight and the content of the unsaturated fatty acid is 0.1 to 5.0% by weight, whereby adhesion can be improved without impairing weather resistance, heat resistance and moisture resistance advantageously.

Meanwhile, the above terpolymer has a bicut softening point of not less than 40° C., whereby the sealing material does not undergo creeping even when the module is exposed to high temperatures during its actual use. Further, the above terpolymer also has a bicut softening point of not more than 110° C., whereby a solar cell module can be easily produced by conventional thermal crimping in the production process, advantageously.

The sealer resin may be crosslinked to improve heat resistance and adhesion. The crosslinking of the sealing material is generally carried out by using an isocyanate, melamine or an organic peroxide.

The crosslinking agent used in the present invention is preferably one which can provide a sufficiently long pot life and a fast crosslinking reaction. Further, since the front surface member is stack on the sealing material, the crosslinking agent is preferably one that releases no or little liberated matters. The examples of the crosslinking agent that meets the above requirements include an organic peroxide. The organic peroxide will be described in detail hereinafter.

In the crosslinking using the organic peroxide, free radials released from the organic peroxide pull hydrogen away from the resin to form C—C bonds. For the activation of the organic peroxide, thermal decomposition, redox decomposition and ionic decomposition are known. In general, heat decomposition is preferably employed.

The organic peroxide is roughly classified into an hydroperoxide, a dialkyl(allyl) peroxide, a diacyl peroxide, a peroxy ketal, a peroxy ester, a peroxy carbonate and a ketone peroxide, on the basis of chemical structure thereof.

The hydroperoxide includes t-butyl peroxide, 1,1,3,3-tetramethylbutyl peroxide, p-menthane hydroperoxide, cumene hydroperoxide, p-cymene hydroperoxide, diisopropyl benzene peroxide, 2,5-dimethylhexane-2,5-dihydroperoxide, cyclohexane peroxide, and 3,3,5-trimethylhexanone peroxide and the like.

The dialkyl(allyl) peroxide includes di-t-butyl peroxide, dicumyl peroxide, t-butyl cumyl peroxide and the like.

The diacyl peroxide includes diacetyl peroxide, dipropionyl peroxide, diisobutyryl peroxide, dioctanoyl peroxide, didecanoyl peroxide, dilauroyl peroxide, bis(3,3,5-trimethylhexanoyl)peroxide, benzoyl peroxide, m-toluyl peroxide, p-chlorobenzoyl peroxide, 2,4-dichlorobenzoyl peroxide, peroxysuccinic acid and the like The peroxy ketal includes 2,2-di-t-butylperoxybutane, 1,1-di-t-butylperoxycyclohexane, 1,1-di-(t-butylperoxy)-3,3,5-trimethylcyclohexane, 2,5-dimethyl-2,5-di(t-butylperoxy)hexane, 2,5-dimethyl-2,5-di(t-butylperoxy)hexyne-3, 1,3-di(t-butylperoxyisopropyl) benzene, 2,5-dimethyl-2,5-dibenzoylperoxyhexane, 2,5-dimethyl-2,5-di(peroxybenzoyl) hexyne-3, n-butyl-4,4-bis(t-butylperoxy) valerate and the like.

The peroxy ester includes t-butyl peroxyacetate, t-butyl peroxyisobutyrate, t-butyl peroxypivalate, t-butyl peroxyneodecanoate, t-butylperoxy-3,5,5-trimethylhexanoate, t-butylperoxy-2-ethylhexanoate, (1,1,3,3-tetramethylbutylperoxy)-2-ethylhexanoate, t-butyl peroxylaurate, t-butyl peroxybenzoate, di(t-butylperoxy) adipate, 2,5-dimethyl-2,5-di(peroxy-2-ethylhexanoyl) hexane, di(t-butylperoxy)isophthalate, t-butyl peroxymalate, acetylcyclohexylsulfonyl peroxide and the like.

The peroxy carbonate includes t-butyl peroxy isopropylcarbonate, di-n-propyl peroxydicarbonate, di-sec-butyl peroxydicarbonate, di(isopropylperoxy) dicarbonate, di(2-ethylhexylperoxy)dicarbonate, di(2-ethoxyethylperoxy)dicarbonate, di(methoxyidopropylperoxy)carbonate, di(3-methoxybutylperoxy)dicarbonate, bis-(4-t-butylcyclohexylperoxy)dicarbonate and the like.

The ketone peroxide includes acetylacetone peroxide, methyl ethyl ketone peroxide, methyl isobutyl ketone peroxide, ketone peroxide and the like. An organic peroxide having a structure other than those listed above includes vinyl tris(t-butylperoxy)silane and the like.

The amount of the above organic peroxide is suitably 0.1 to 5 parts by weight based on 100 parts by weight of the resin.

The crosslinking of the sealing material which has been mixed with the above organic peroxide and the thermal crimping of the solar cell module can be carried out under pressure and heating. The heating temperature and time can be determined according to the thermal decomposition temperature properties of each individual organic peroxide. The heating is completed at a temperature and for a time such that thermal decomposition can proceed as much as preferably 90%, more preferably 95% or more. To apply pressure, there can be used a method of applying pressure by means of a heating roller or a hot press and a method of applying pressure by means of atmospheric pressure by reducing pressure within the system using an air bag-like jig. To carry out the above crosslinking reaction efficiently, it is desirable to use triallyl cyanurate, which is called a crosslinking assistant. The crosslinking assistant is preferably added in an amount of 0.1 to 5 parts by weight based on 100 parts by weight of the resin.

Further, when the terpolymer contains maleic anhydride, a polyhydric alcohol can be added as the crosslinking agent. That is, the hydroxyl groups of the polyhydric alcohol are reacted with maleic anhydride to form a crosslinked structure. The examples of the polyhydric alcohol include alcohol compounds such as ethylene glycol, glycerine, 1,4-butanediol, 1,6-hexanediol, 1,8-octanediol, 1,10-decanediol, trimethylolmethane, trimethylolethane, trimethylolpropane and pentaerythritol; polyethylene glycols such as diethylene glycol, triethylene glycol and tetraethylene glycol; polyglycerins such as diglycerine, triglycerrine and tetraglycerine; saccharides such as arabitol, sorbitol, xylose, arabinose, glucose, galactose, sorbose, fructose, palatinose, maltotriose, melezitose and sorbitan; dehydrated condensates of these saccharides; polyoxyalkylene compounds obtained by adding ethylene oxide or propylene oxide to the above compounds; compounds obtained by partially esterifying the above compounds with a carboxylic acid; compounds obtained by partially esterifying the above polyoxyalkenylene compounds with a carboxylic acid; polyoxyalkylene compounds obtained by adding ethylene oxide or propylene oxide to the above partially esterified compounds; and polymers having at least two hydroxyl groups such as a saponified product of an ethylene-vinyl acetate copolymer, a polyvinyl alcohol, a polyolefin-based oligomer having at least two hydroxyl groups, an ethylene-hydroxyethyl acrylate copolymer and an ethylene-hydroxyethyl methacrylate copolymer, These polyhydric alcohol compounds can be used in combination of two or more kinds.

The amount of the above polyhydric alcohol is preferably such that the molar ratio of the hydroxyl group contained in the polyhydric alcohol to the acid anhydride contained in the terpolymer is in the range of 0.05 to 5.

To promote the reaction between the hydroxyl group and the acid anhydride and carry out the crosslinking reaction efficiently, it is desirable to use a reaction accelerator, which is exemplified by the metal salt of an organic carboxylic acid. The metal salt of the organic carboxylic acid is preferably added in an amount of 0.01 to 15 parts by weight based on 100 parts by weight of the resin.

A thermal antioxidant is often added to the sealing material to impart stability under high temperature conditions to the material. It is suitably added in an amount of 0.1 to 1 part by weight based on 100 parts by weight of the resin.

The antioxidant is roughly classified into a monophenol-based antioxidant, a bisphenol-based antioxidant, a polymeric phenol-based antioxidant, a sulfur-based antioxidant and a phosphoric acid-based antioxidant, on the basis of chemical structure thereof.

The monophenol-based antioxidant includes 2,6-di-t-butyl-p-cresol, butyl hydroxy anisole and 2,6-di-t-butyl-4-ethylphenol.

The bisphenol-based antioxidant includes 2,2'-methylene-bis-(4-methyl-6-t-butylphenol), 2,2'-methylene-bis-(4-ethyl-6-t-butylphenol), 4,4'-thio-bis-(3-methyl-6-t-butylphenol), 4,4'-butylidene-bis-(3-methyl-6-t- butylphenol) and 3,9-bis{[1,1-dimethyl-2-(β-(3-t-butyl-4-hydroxy-5-methyl phenyl)propionyloxy,ethyl, 2,4,8,10-tetraoxaspiro}5,5-undecane.

The polymeric phenol-based antioxidant includes 1,1,3-tris-(2-methyl-4-hydroxy-5-t-butylphenyl) butane, 1,3,5-trimethyl-2,4,6-tris(3,5-di-t-butyl-4-hydroxybenzyl) benzene, tetrakis-{methylene-3-(3',5'-di-t-butyl-4'-hydroxyphenyl)propionate}methane, bis-{(3,3'-bis-4'-hydroxy-3'-t-butylphenyl)butylic acid}glucosyl ester, 1,3,5-tris(3',5'-di-t-butyl-4'-hydroxybenzyl)-s-triazine-2,4,6-(1H, 3H,5H)trione and tocopherol(vitamin E).

Meanwhile, the sulfur-based antioxidant includes dilauryl thiodlpropionate, dimyristyl thiodipropionate and distearyl thiopropionate.

The phosphoric acid-based antioxidant includes triphenyl phosphate, diphenylisodecyl phosphite, phenyldiisodecyl phosphite, 4,4'-butylidene-bis-(3-methyl-6-t-butylphenyl-di-tridecyl)phosphite, cyclic neopentanetetraylbis (octadecylphosphite), tris(mono and/or diphenyl)phosphite, diisodecyl pentaerythritol diphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentanetetraylbis (2,4-di-t-butylphenyl)phosphite, cyclic neopentanetetraylbis (2,6-di-t-methylphenyl)phosphite and 2,2-methylenebis(4,6-t-butylphenyl)octyl phosphite.

Further, it is desirable to add an ultraviolet absorber in order to improve weather resistance by suppressing the light degradation of the sealing material and to protect the underlying layer of the sealing material. The ultraviolet absorber is added in an amount of about 0.1 to 0.5 parts by weight based on 100 parts by weight of the resin. Known compounds can be used as the ultraviolet absorber. The ultraviolet absorber is roughly classified into a salicylic acid-based ultraviolet absorber, a benzophenone-based ultraviolet absorber, a benzotriazole-based ultraviolet absorber and a cyanoacrylate-based ultraviolet absorber, on the basis of chemical structure thereof The salicylic acid-based ultraviolet absorber includes phenyl salicylate, p-t-butylphenyl salicylate and p-octylphenyl salicylate.

The benzophenone-based ultraviolet absorber includes 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone and bis(2-methoxy-4-hydroxy-5-benzophenone)methane.

The benzotriazole-based ultraviolet absorber includes 2-(2-hydroxy-5-methylphenyl)benzotriazole, 2-(2-hydroxy-5-t-butylphenyl)benzotriazole, 2-(2-hydroxy-3,5-di-t-butylphenyl)benzotriazole, 2-(2-hydroxy-3-t-butyl-5-methylphenyl)-5-chlorobenzotriazole, 2-(2-hydroxy-3,5-di-t-butylphenyl)-5-chlorobenzotriazole, 2-(2-hydroxy-3,5-di-t-amylphenyl)benzotriazole, 2-{2-hydroxy-3-(3,4,5,6-tetrahydrophthalimidemethyl)-5-methylphenyl}benzotriazole and 2,2-methylenebis(4-(1,1,3,3-tetramethylbutyl)-6-(2H-benzotriazole-2-yl)phenol).

The cyanoacrylate-based ultraviolet absorber includes 2-ethylhexyl-2-cyano-3,3'-diphenyl acrylate and ethyl-2-cyano-3,3'-diphenyl acrylate.

Of these ultraviolet absorbers, the benzophenone-based ultraviolet absorber and the benzotriazole-based ultraviolet absorber are suitable for use as a sealing material for a solar cell because it has almost no absorption in the visible light range of 400 nm or higher and has high thermal stability.

In addition to the above ultraviolet absorbers, a hindered amine light stabilizer is also known to be used for providing weather resistance. Although the hindered amine light stabilizer does not carry out absorption of ultraviolet light which the ultraviolet absorber does, it exhibits a significant synergistic is effect when used together with the ultraviolet absorber. It is generally added in an amount of about 0.1 to 0.3 part by weight based on 100 parts by weight of the resin. Of course, light stabilizers other than the hindered amine light stabilizer are also available; however, since they are often colored, they cannot be desirably used in the sealing material of the present invention. When the module itself is to be colored, however, the use of the colored light stabilizer is also considered.

The hindered amine light stabilizer includes a dimethyl succinate-1-(2-hydroxyethyl)-4-hydroxy-2,2,6,6-tetramethylpiperazine polycondensate, poly[{6-(1,1,3,3-tetramethylbutyl)amino-1,3,5-triazine-2,4,-diyl}{(2,2,6,6-tetramethyl-4-piperidyl)imino}hexamethylene{(2,2,6,6-tetramethyl-4-piperidyl)imino}], N,N'-bis(3-aminopropyl)ethylenediamine-2, 4-bis[N-butyl-N-(1,2,2,6,6-pentamethyl-4-piperidyl)amino]-6-chloro-1,3,5-triazine condensate, bis(2,2,6,6-tetramethyl-4-piperidyl)sebacate and 2-(3,5-di-t-4-hydroxybenzyl)-2-n-butyl malonate bis(1,2,2,6,6-pentamethyl-4-piperidyl).

In consideration of the circumstances under which the solar cell module is used, it is preferable to use a low volatile ultraviolet absorber, light stabilizer and thermal antioxidant.

When the solar cell module is expected to be used under severer circumstances, it is preferable to reinforce the adhesive strength between the sealing material and the photovoltaic element and between the sealing material and the front surface member. The above adhesive strength can be reinforced by adding a silane coupling agent or an organic titanate compound to the sealing material. The silane coupling agent includes vinyl trichlorosilane, vinyl tris(β-methoxyethoxy)silane, vinyl triethoxysilane, vinyl trimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane and γ-chloropropyltrimethoxysilane.

Meanwhile, to minimize a reduction in the quantity of light reaching the photovoltaic element, the light permeability of the sealer resin (front surface sealing material) 102 is desirably 80% or higher, more desirably 90% or higher, in the visible light wavelength range of 400 to 800 nm. Further, to facilitate the incidence of light from air, it preferably has a refractive index of 1.1 to 2.0, more preferably 1.1 to 1.6.

The back surface sealing material 104 is provided to protect the photovoltaic element from exposure to the outdoors by covering the unevenness of the back surface of the element with the resin. Further, it also serves to bond the back surface member 105 to the element. Therefore, the back surface sealing material, like the front surface sealing material, is required to have weather resistance, adhesion and heat resistance. Thus, it is preferable that the material suitable for use as the front surface sealing material should also be used as the back surface sealing material. In general, the same material is used for both the front surface sealing material and the back surface sealing material. However, since transparency is optional, a filler such as an inorganic oxide may be added to the sealing materials to improve weather resistance and mechanical strength, or a pigment may be added to color them.

Figure 2A:
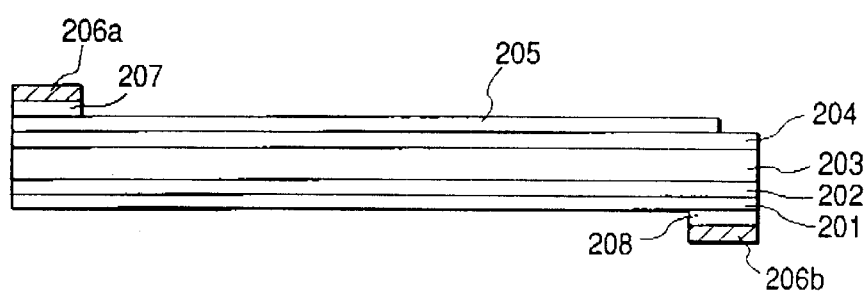
FIGS. 2A and 2B are schematic cross-sectional views showing the basic structure of a photovoltaic element used in the solar cell module shown in FIG. 1 and a top view of the light-receiving surface of the photovoltaic element, respectively.
Figure 2B:
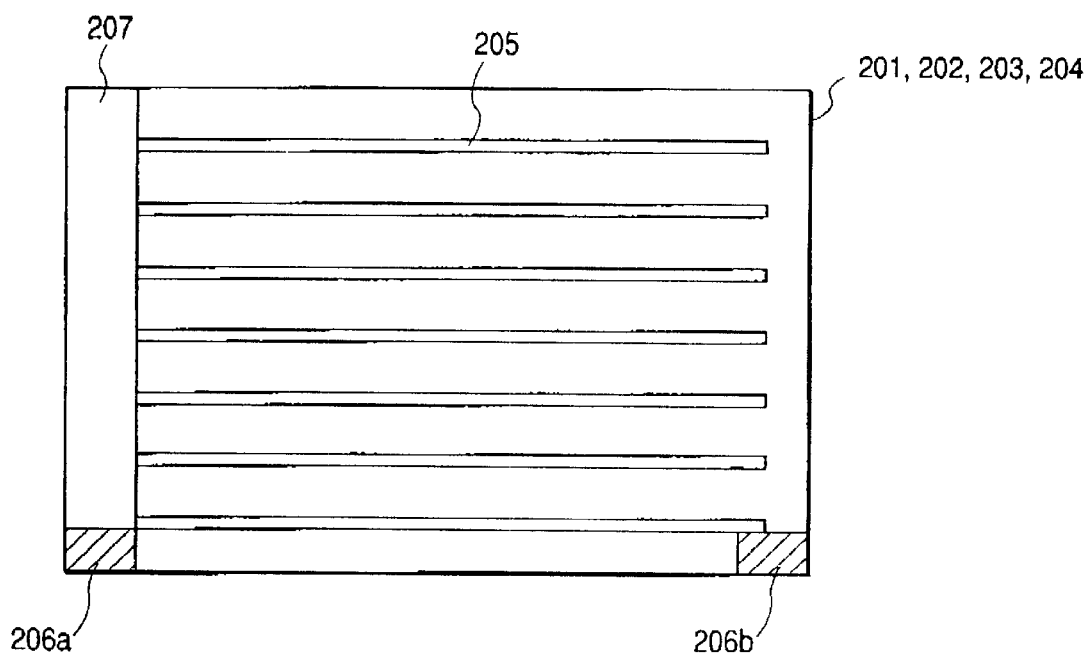

As the photovoltaic element 101 in the present invention, conventionally known elements such as a crystal silicon solar cell, a polycrystal silicon solar cell, an amorphous silicon solar cell, a microcrystal silicon solar cell, a thin film crystal silicon solar cell, a copper indium selenide solar cell and a compound semiconductor solar cell can be selectively used according to application purposes. The photovoltaic element that can be suitably sealed by the terpolymer of the present invention is, for example, one that has a semiconductor photoactive layer, which is a light-converting member, and a transparent conductive layer formed on a conductive substrate. A schematic block diagram of such a photovoltaic element is shown in FIGS. 2A and 2B. FIG. 2A is a schematic cross-sectional view of the photovoltaic element, while FIG. 2B is a schematic top view of the photovoltaic element. In these figures, reference numeral 201 denotes a conductive substrate, 202 a back surface reflective layer, 203 a semiconductor photoactive layer, 204 a transparent conductive layer, 205 a collecting electrode, 206a and 206b output-terminals, and 207 and 208 conductive adhesives or conductive pastes.

The conductive substrate 201 serves not only as the substrate of the photovoltaic element but also as the lower electrode. The material of the conductive substrate 201 may be silicon, tantalum, molybdenum, tungsten, stainless steel, aluminum, copper, titanium, a carbon sheet, a lead-plated steel plate, or a resin film or ceramic with a conductive layer formed thereon. Of these, stainless steel is suitable because it has high durability and exhibits excellent adhesion to the terpolymer of the present invention.

On the above conductive substrate 201 may be formed a metal layer, a metal-oxide layer, or both, as the back surface reflective layer 202. The metal layer may be formed of, for example, Ti, Cr, Mo, W, Al, Ag or Ni, while the metal-oxide layer may be formed of, for example, ZnO, $TO_2$ and $SnO_2$. The above metal layer and the above metal-oxide layer may be formed by means of resistance heating vapor deposition, electron beam vapor deposition or sputtering.

The semiconductor photoactive layer 203 is a portion for conducting photoelectric conversion. Specific examples of the material forming the layer are pn junction-type polycrystal silicon, pin junction-type amorphous silicon, pin junction-type microcrystal silicon, or a compound semiconductor as typified by $CuInSe_2$, $CuInS_2$, GaAs, $CdS/Cu_2S$, CdS/CdTe, CdS/InP and $CdTe/Cu_2Te$. Of these, pin junction-type amorphous silicon is suitable because it is inexpensive and relatively easy to process.

The above semiconductor photoactive layer can be formed by the formation of molten silicon into a sheet or the heat treatment of amorphous silicon in the case of polycrystal silicon, by plasma chemical vapor deposition using a silane gas or the like as a raw material in the case of amorphous silicon and microcrystal silicon, and by ion plating, ion beam deposition, vacuum deposition, sputtering or electrodeposition in the case of the compound semiconductor.

The transparent conductive layer 204 serves as the upper electrode of the solar cell. It may be formed of, for example, $In_2O_3$, $SnO_2$, $In_2O_3$—$SnO_2$(ITO), ZnO, $TiO_2$, $Cd_2SnO_4$, or a crystalline semiconductor layer doped with a high concentration of impurities. It may be formed by resistance heating vapor deposition, sputtering, spraying, chemical vapor deposition, or impurity diffusion.

Incidentally, in the photovoltaic element on which the transparent conductive layer 204 has been formed, the conductive substrate and the transparent conductive layer may be partially short-circuited due to the unevenness of the surface of the conductive substrate 201 and/or the non-uniformity at the time of forming the semiconductor photoactive layer. In this case, a large amount of leakage current flows in proportion to an output voltage; that is, leakage resistance (shunt resistance) is low. Thus, to repair the short-circuited portion, it is desirable to subject the photovoltaic element to a defect removing treatment after the formation of the transparent conductive layer. Such a defect removing treatment is described in detail in U.S. Pat. No. 4,729,970. By this treatment, the shunt resistance of the photovoltaic element is adjusted to be 1 to 500 $k\Omega \cdot cm^2$, desirably 10 to 500 $k\Omega \cdot cm^2$.

On the transparent conductive layer 204 may be formed the collecting electrode 205 (grid) having the shape of a grid, comb, line or the like, in order to collect an electric current efficiently. Specific examples of the material forming the collecting electrode 205 are Ti, Cr, Mo, W, Al, Ag, Ni, Cu, Sn, or a conductive paste typified by a silver paste. The collecting electrode 205 may be formed by sputtering using a masking pattern, resistance heating, chemical vapor deposition, a patterning method comprising the steps of forming a metal film all over the layer by vapor deposition and removing unnecessary portions of the film by etching, a method of directly forming a grid electrode pattern by photo-chemical vapor deposition, a method comprising the steps of forming the negative masking pattern of a grid electrode pattern and plating the patterned surface, a method of printing a conductive paste, a method of soldering metal wires on a printed conductive paste, or the like. As the conductive paste, for example, a binder polymer in which silver, gold, copper, nickel, carbon or the like has been dispersed in the form of a fine powder is generally used. The binder polymer includes polyester resin, epoxy resin, acryl resin, alkyd resin, polyvinyl acetate resin, rubber, urethane resin and phenol resin.

Finally, the output-terminals 206 are attached on the conductive substrate 201 and the other on the collecting electrode 205, respectively, in order to take out an electromotive force. The attachment of the output-terminal 206 on the conductive substrate is formed by bonding a metal body such as a copper tab to the conductive substrate by spot welding or soldering, while the attachment of the output-terminal on the collecting electrode is formed by electrically connecting a metal body to the collecting electrode by means of a conductive paste or solders 207 and 208.

The photovoltaic elements produced as described above are connected either in series or in parallel according to a desired voltage or current. Further, the desired voltage or current may be obtained by integrating the photovoltaic elements on an insulated substrate.

The front surface member 103 in FIG. 1 is required to have such properties as typified by weather resistance, stain resistance and mechanical strength because the member is the outermost layer of the solar cell module, as well as such performance that ensures the long-term reliability of the solar cell module during exposure to the outdoors. The member that can be suitably used in the present invention includes a (reinforced) glass sheet and a fluoride polymer film. As the glass sheet, a white glass sheet which has high light permeability is preferably used. The fluoride polymer film includes an ethylene tetrafluoride-ethylene copolymer (ETFE), a polyvinyl fluoride resin (PVF), a polyvinylidene fluoride resin (PVDF), a tetrefluoroethylene resin (TFE), an ethylene tetrafluoride-propylene hexafluoride copolymer (FEP) and chlorotrifluoroethylene (CTFE). The polyvinylidene fluoride resin is superior in view of weather resistance, while the ethylene tetrafluoride-ethylene copolymer is superior in view of compatibility between weather resistance and mechanical strength. To improve adhesion between the fluoride polymer film and the sealing material, it is desirable to subject the film to a corona treatment or a plasma treatment. Further, a stretched film can also be used to improve mechanical strength.

The back surface member 105, as required, serves to maintain electrical insulation between the photovoltaic element 101 and the outside and to improve weather resistance and functions as a reinforcing material. The back surface member is preferably formed of a material that can ensure sufficient electrical insulating properties, has excellent long-term durability, can withstand thermal expansion and thermal contraction and has flexibility. The material that can be suitably used includes a nylon film, a polyethylene terephthalate (PET) film and a polyvinyl fluoride film. When moisture resistance is required, an aluminum-laminated polyvinyl fluoride film, an aluminum-deposited PET film, a silicon oxide-deposited PET film and the like are used. Further, to improve the fire resistance of the module, a film-laminated galvanized iron foil, stainless steel foil or the like can be used as the back surface member. On the external surface of the back surface member may be attached a supporting plate in order to improve the mechanical strength of the solar cell module or to prevent the distortion and warpage of the back surface member caused by a change in temperature. Preferable examples of the supporting plate are a steel plate, a plastic plate and an FRP (fiber reinforced plastics) plate. Further, a building material can be attached on the back surface member to form a building material combination type solar cell module. As the building material, there can be selectively used a metal plate, a slate board, a gypsum board, a roof tile, a fiber reinforced plastic, glass and the like. Particularly, a weather-resistant metal plate such as a galvanized iron sheet, a galbarium steel plate, a stainless steel plate and an aluminum plate is suitably used for the building (or roof) material combination type solar cell module because it is light and easy to process.

The procedure of producing the solar cell module using the aforementioned photovoltaic element, sealer resin, front surface member and back surface member will be described hereinafter.

To cover the photovoltaic element with the sealer resin, there is generally employed a method in which the thermally molten sealing material is extruded from a slit as of a T-die to form a sheet, which is then thermally crimped onto the element. This sealing material sheet is inserted between the element and the front surface member and between the element and the back surface member and thermally crimped to form the solar cell module.

To conduct the thermal crimping, conventionally known methods such as vacuum lamination and roll lamination can be selectively used.

The solar cell module of the present invention will be described in detail with reference to examples hereinafter. The solar cell module with regard to the present invention shall not be limited to the following examples and can be modified without deviating from the spirit of the present invention.

EXAMPLE 1

[Photovoltaic Element]

First, an amorphous silicon (a-Si) solar cell (photovoltaic element) was produced. The production process will be described with reference to FIGS. 2A and 2B.

On the stainless steel substrate which had been cleaned, an Al layer (having a thickness of 5000 Å) and a ZnO layer (having a thickness of 5000 Å) were formed successively as the back surface reflective layer 202. Then, by plasma chemical vapor deposition, there were formed an n-type a-Si layer from a mixed gas of $SiH_4$, $PH_3$ and $H_2$, an i-type a-Si layer from a mixed gas of $SiH_4$ and $H_2$, and a p-type microcrystal silicon ($\mu$c-Si) layer from a mixed gas of $SiH_4$, $BF_4$, and $H_2$, to form a tandem-type a-Si photoelectric conversion semiconductor layer 203 having a layer structure of 150-Å-thick n-type layer/4000-Å-thick i-type layer/100-Å-thick p-type layer/100-Å-thick n-type layer/800-Å-thick i-type layer/100-Å-thick p-type layer. Then, as the transparent conductive layer 204, an $In_2O$ thin film (having a thickness of 700 Å) was formed by depositing In under an $O_2$ atmosphere by means of resistance heating.

Thereafter, the photovoltaic element was subjected to a defect removing treatment. That is, in the aqueous solution of aluminum chloride prepared so as to have an electric conductivity of 50 to 70 mS, the photovoltaic element and an electrode plate were immersed such that the electrode plate was faced with the transparent conductive layer of the element, and a positive electric potential of 3.5 volts was applied to the electrode plate for 2 seconds, with the element being a ground, to selectively decompose the shunted portions of the transparent conductive layer. After this treatment, the shunt resistance of the photovoltaic element was improved to 50 to 200 k$\Omega$·cm$^2$, while it was 1 to 10 k$\Omega$·cm$^2$ before the treatment.

Further, the grid-shaped collecting electrode 205 was formed by screen-printing a sliver paste. Finally, a copper tab was attached, as the negative terminal 206b, on the stainless steel substrate by using the stainless steel solder 208, and a silver foil tape was attached, as the positive terminal 206a, on the collecting electrode 205 by using the conductive adhesive 207 to form output terminals. Thus, the photovoltaic element was obtained. Then, a plurality of such photovoltaic elements were connected in series to form a group of photovoltaic elements.

Finally, the positive electrode of the positive terminal and the negative electrode of the negative terminal were extended and placed at the back of the group of photovoltaic elements to form output-retrieving electrodes.

Next, the production process of the solar cell module will be described with reference to FIG. 3.

[Sealing material]

The sealing material 302 was prepared by mixing 3 parts by weight of 2,5-dimethyl-2,5-bis(t-butylperoxy)hexane as a crosslinking agent, 0.3 parts by weight of γ-methacryloxypropyltrimethoxysilane as a silane coupling agent, 0.3 parts by weight of 2-hydroxy-4-n-octoxybenzophenone as an ultraviolet absorber, 0.1 parts by weight of bis(2,2,6,6-tetramethyl-4-piperidyl)sebacate as a light stabilizer and 0.2 parts by weight of tris(mono-nonylphenyl) phosphate as an antioxidant, based on 100 parts by weight of an ethylene-methyl acrylate-maleic anhydride terpolymer (EMM) resin pellet (methyl acrylate content: 20 wt %, maleic anhydride content: 3 wt %, bicut softening point: 55° C.); melting the obtained mixture under heating; and extruding the molten mixture from the slit of a T-die to form into a sheet-shaped EMM (hereinafter, referred to as "EMM sheet") having a thickness of 400 μm.

As the front surface film 303 was used an ETFE film (having a thickness of 50 μm) whose surface in contact with the underlying sealing material had been treated with corona discharge. As the back surface film 304 was used a polyethylene terephthalate (PET) film (having a thickness of 100 μm). As the supporting plate 305 was used a roofing galbarium steel plate (having a thickness of 0.4 mm).

[Lamination]

Figure 3:
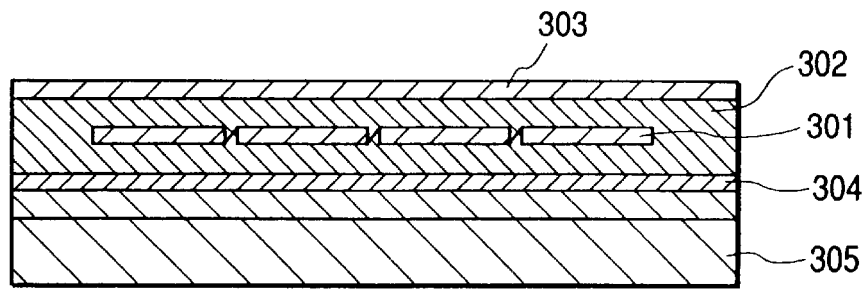
FIG. 3 is a schematic cross-sectional view of the solar cell module of Example 1 according to the present invention.

Using the above covering materials, the group of photovoltaic elements 301 were laminated in the configuration shown in FIG. 3. That is, the above EMM sheet and the above ETFE film were laminated on the light-receiving surfaces of the photovoltaic elements and the EMM sheet, the PET film and the supporting plate were laminated on the back surfaces of the photovoltaic elements, and the resulting laminate was heated at 150° C. for 30 minutes with a vacuum lamination apparatus in action for pressure deaeration. The output terminals were turned onto the back surface of the element so as to, after the lamination, allow an output to be taken out, after the lamination, from the terminal outlets that had been formed in the galbarium steel plate in advance.

By the above steps, a plurality of the solar cell modules to which the present invention had been applied were obtained.

EXAMPLE 2

A solar cell module was produced in the same manner as in Example 1 except that an ethylene-isobutyl acrylate-methacrylic acid terpolymer (EiBAMMA) resin (isobutyl acrylate content: 20 wt. %, methacrylic acid content: 8 wt. %, bicut softening point: 40° C.) was used in place of the ethylene-methyl acrylate-maleic anhydride terpolymer (EMM) resin.

EXAMPLE 3

A solar cell module was produced in the same manner as in Example 1 except that an EMM resin pellet having a methyl acrylate content of 25 wt. %, a maleic anhydride content of 1.5 wt. % and a bicut softening point of 40° C. was used as the EMM resin.

EXAMPLE 4

A solar cell module was produced in the same manner as in Example 2 except that an EiBAMMA resin pellet having an isobutyl acrylate content of 15 wt. %, a methacrylic acid content of 4 wt. % and a bicut softening point of 60 °C. was used as the EIBAMMA resin.

EXAMPLE 5

An EMM sheet was prepared in the same manner as in Example 1 except that a crosslinking agent was not added and that vacuum lamination was carried out by reducing heating time by 10 minutes because crosslinking was not necessary.

EXAMPLE 6

The procedure of Example 1 was followed to the point where a group of photovoltaic elements were produced.

[Modularization]

Figure 4:
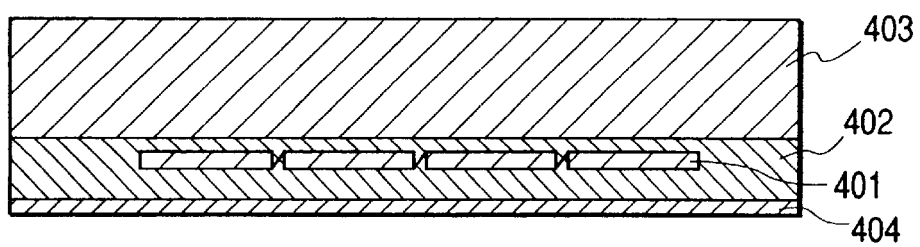
FIG. 4 is a schematic cross-sectional view of the solar cell module of Example 6 according to the present invention.
Figure 5:
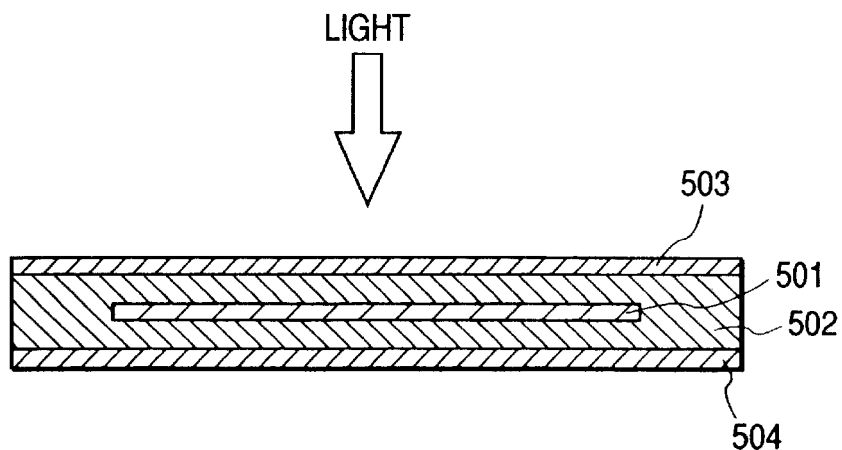
FIG. 5 is a schematic cross-sectional view of one example of convent ion al solar cell modules.

The procedure of producing a solar cell module by covering a group of photovoltaic elements will be described with reference to FIG. 4.

Reference numeral 401 denotes a group of photovoltaic elements, 402 a sealer resin, 403 a cover glass, and 404 a back surface film. A solar cell module laminate was formed by laminating the group of photovoltaic elements 401, the EMM sheet 402 (having a thickness of 400 μm) prepared in Example 1, the white reinforced glass sheet 403 (having a thickness of 3.3 mm), and the polyethylene terephthalate (PET) film 404 (having a thickness of 100 μm) whose surface in contact with the sealing material had been treated with corona discharge, in the order of glass/EMM sheet/photovoltaic elements/EMM sheet/PET film. A solar cell module was obtained by heating the laminate at 150° C. for 30 minutes with a vacuum lamination apparatus in action for pressure deaeration.

The output terminals were turned onto the back surfaces of the elements in advance so as to allow an output to be taken out by forming holes in the back surface sealing material and the back surface film after lamination.

COMPARATIVE EXAMPLE 1

A solar cell module was obtained in the same manner as in Example 1 except that an EVA resin (vinyl acetate content: 33 wt. , bicut softening point: less than 40° C.) was used in place of the EMM resin.

COMPARATIVE EXAMPLE 2

The procedure of Example 1 was repeated except that an EVA resin having a vinyl acetate content of 28 wt. % an a bicut softening point of 42° C. was used in place of the EMM resin.

COMPARATIVE EXAMPLE 3

The procedure of Example 1 was repeated except that an EEA resin (ethyl acrylate content: 25 wt. %, bicut softening point; 40° C.) was used in place of the EMM resin.

COMPARATIVE EXAMPLE 4

The procedure of Example 1 was repeated except that an EMA resin (methyl acrylate content: 20 wt. %, bicut softening point: 43° C.) was used in place of the EMM resin.

COMPARATIVE EXAMPLE 5

The procedure of Example 1 was repeated except that an EMAA resin (methacrylic acid content: 15 wt. %, bicut softening point: 64° C.) was used in place of the EMM resin.

COMPARATIVE EXAMPLE 6

A solar cell module was obtained in the same manner as in Example 6 except that an EVA resin (vinyl acetate content: 33 wt. %, bicut softening point: less than 40° C.) was used in place of the EMM resin.

(Evaluation method)

The solar cell modules obtained in the above Examples and Comparative Examples were evaluated for the following items.

(1) Weather resistance

The solar cell module was placed in a sunshine weather meter (produced by SUGA SHIKENKI K.K.), and an accelerated weathering test was conducted by exposing the solar cell module to an eight-minute rainfall at intervals of two hours with a xenon lamp (irradiation intensity: 3 SUN, atmosphere: black panel temperature of 83° C./humidity of 50%EH) radiating the module. A change in the appearance of the module after conducting the above test for 5,000 hours was observed. In Table 1, the solar cell modules having no change in appearance were represented by "O", while those having a change in appearance were given brief comments on their appearance.

(2) Moisture Resistance

The solar cell module was placed in the atmosphere of 85° C./85%RH for 1,000 hours with a solar simulator irradiating the light-receiving surface thereof with simulated sunlight of 100 mW/cm$^2$, and the conversion efficiency of the solar cell module under the irradiation of the light of 100 mW/cm$^2$ with AM of 1.5 was measured before and after the test. This was conducted on 10 modules, and the relative reduction ratio of the average conversion efficiency of the ten modules was determined. For reference sake, the modules used in this test had been exposed to light before the test to stabilize conversion efficiency thereof sufficiently. Further, the shunt resistances of the ten modules in a dark state were also measured before and after the test, and the relative reduction ratio of the average shunt resistance of the ten modules was determined. Furthermore, a change in the appearance of the module after the test was observed. In Table 1, the modules having no change in appearance were represented by "O", while those having a change in appearance were given brief comments on their appearance.

(3) Temperature and Moisture Cycling

A temperature and moisture cycling test was conducted for 10 cycles under the conditions of −40° C./30 min and 85° C./85%RH/20 hours to observe a change in the appearance of the module after the test. In Table 1, the modules having no change in appearance were represented by "O", while those having a change in appearance were given brief comments on their appearance.

(4) Heat Resistance

The solar cell module was left to stand in the atmosphere of 95° C. for 1,000 hours to observe a change in appearance. In Table 1, the modules having no change in appearance were represented by "O", while those having a change in appearance were given brief comments on their appearance.

The results are shown in Table 1.

TABLE 1

Evaluation results of the solar cell modules of Examples and Comparative Examples

| Evaluation Items | Weather Resistance Appearance | Appearance | Moisture Resistance Reduction ratio of Conversion Efficiency | Reduction ratio of Shunt Resistance | Temperature and Moisture Cycle Appearance | Heat Resistance Test Appearance |
|---|---|---|---|---|---|---|
| Ex. 1 | o | o | 2% | 73% | o | o |
| Ex. 2 | o | o | 3% | 92% | o | o |
| Ex. 3 | o | o | 2% | 85% | o | o |
| Ex. 4 | o | o | 1% | 81% | o | o |
| Ex. 5 | o | o | 3% | 78% | o | 6* |
| Ex. 6 | o | o | 0% | 4% | o | o |
| C. Ex. 1 | 1* | 3* | 23% | 99% | o | 2* |
| C. Ex. 2 | o | 4* | 18% | 98% | o | 2* |
| C. Ex. 3 | o | 5* | 5% | 87% | 1* | o |
| C. Ex. 4 | o | 5* | 4% | 85% | 1* | o |
| C. Ex. 5 | 1* | o | 12% | 96% | o | o |
| C. Ex. 6 | 2* | 4* | 2% | 3% | o | 2* |

Ex.: Example; C. Ex.: Comparative Example
1*Peeling occurred between the front surface film and the sealing material.
2*The sealing material was discolored yellow.
3*Peeling occurred between the front surface film and the sealing material, and the copper tab on the surface of the element which was in contact with the sealing material was discolored green.
4*The copper tab on the surface of the element which was in contact with the sealing material was discolored green.
5*The lifting of the cell occurred due to the peeling between the back surface of the element and the sealing material.
6*The sealing material was slightly deformed.

As is clear from Table 1, the solar cell module sealed by the resin of the present invention is excellent in any of weather resistance, moisture resistance and heat resistance. In the case of Example 5, although the slight deformation of the sealing material was observed because it had not been crosslinked, the deformation was negligible in actual use.

In Comparative Examples 1 and 2, there occurred peeling and yellowing that were presumably caused by the decomposition of the sealing material, and the copper tab, which was one of electrode members, corroded due to the acid generated by decomposition. Further, a great reduction in shunt resistance that was presumably caused by the generation of acid and the water absorption by the resin was observed, and a reduction in conversion efficiency which is associated with the reduction in shunt resistance is significant.

Meanwhile, in Comparative Examples 3 and 4, there occurred peeling that was presumably caused by the substantially low adhesion of the sealing material.

In Comparative Example 6, yellowing of the sealing material occurred in the weather resistance test. It is assumed that since the module of Comparative Example 6 was covered with glass, the acid generated by decomposition was accumulated in the sealing material and, with the acid as a catalyst, the degradation of the sealing material was promoted.

Incidentally, the solar cell module of the present invention shall not be limited to the above Examples and can be modified without deviating from the spirit of the present invention.

According to the present invention, in a solar cell module in which the light-receiving surface and/or non-light-receiving surface of a photovoltaic element are/is sealed by organic polymeric resin layers, when at least one of the organic polymeric resin layers contains a specific ethylene-unsaturated fatty acid ester-unsaturated fatty acid terpolymer, a solar cell module having excellent weather resistance, heat resistance and moisture resistance and an excellent photoelectric conversion efficiency can be provided. That is, the sealing material has high light permeability, peeling hardly occurs between the sealing material and other members, and the corrosion of the photovoltaic element and the reduction of shunt resistance can be inhibited, whereby stable solar cell performance can be maintained over a long period of time.

What is claimed is:

1. A solar cell module comprising a photovoltaic element and polymeric resin layers for sealing a light-receiving surface and/or non-light-receiving surface of the photovoltaic element, wherein at least one of the polymeric resin layers contains an ethylene-methyl acrylate-maleic anhydride terpolymer, an ethylene-isobutyl acrylate-methacrylic acid terpolymer or a mixture thereof.

2. The solar cell module according to claim 1, wherein the terpolymer has an ethylene content of 65 to 89.9% by weight, a methyl acrylate or isobutyl acrylate content of 10 to 30% by weight, a maleic anhydride or methacrylic acid content of 0.1 to 5.0% by weight.

3. The solar cell module according to claim 1, wherein the terpolymer has a bicut softening point of 40° C. to 110° C.

4. The solar cell module according to claim 1, wherein the terpolymer contains a hindered amine light stabilizer.

5. The solar cell module according to claim 1, wherein the terpolymer contains an ultraviolet absorber.

6. The solar cell module according to claim 5, wherein the ultraviolet absorber is selected from the derivatives of benzophenone and benzotriazole.

7. The solar cell module according to claim 1, wherein the terpolymer contains a silane coupling agent.

8. The solar cell module according to claim 1, wherein the terpolymer contains a hindered phenol antioxidant.

9. The solar cell module according to claim 1, wherein the terpolymer has a total light permeability of 90% or more over a wavelength range of 400 to 1,000 nm when having a thickness of 0.5 mm.

10. The solar cell module according to claim 1, wherein the photovoltaic element has on a conductive substrate as a first electrode a semiconductor photoactive layer, which is a light-converting member, and a transparent conductive layer as a second electrode formed thereon.

11. The solar cell module according to claim 10, wherein the semiconductor photoactive layer contains an amorphous semiconductor or a microcrystal semiconductor.

12. The solar cell nodule according to claim 11, wherein the semiconductor is amorphous silicon or microcrystal silicon.

13. The solar cell module according to claim 10, wherein the conductive substrate is made of stainless steel.

14. The solar cell module according to claim 1, wherein a short circuited portion of the photovoltaic element is repaired by a defect removing treatment.

15. The solar cell module according to claim 1, wherein the photovoltaic element has a shunt resistance of 1 to 500 $k\Omega \cdot cm^2$.

16. The solar cell module according to claim 1, wherein the photovoltaic element has on the light-receiving surface a collecting electrode which contains copper or silver as one of its constituents, and the terpolymer is placed in contact with the collecting electrode.

17. The solar cell module according to claim 1, wherein the light-receiving surface of the photovoltaic element is covered with the terpolymer and then a thin fluoride polymer film is stacked thereon as the outermost layer.

18. The solar cell module according according to claim 1, wherein the photovoltaic element is bonded to a building material via an adhesive layer.

19. The solar cell module according to claim 1, wherein the highest operating temperature is 80° C. or higher.

* * * * *

UNITED STATES PATENT AND TRADEMARK OFFICE
CERTIFICATE OF CORRECTION

PATENT NO.   : 6,414,236 B1
DATED        : July 2, 2002
INVENTOR(S)  : Ichiro Kataoka et al.

It is certified that error appears in the above-identified patent and that said Letters Patent is hereby corrected as shown below:

Column 1,
Line 33, "The most generally," should read -- Generally, --;
Line 56, "lower" should read -- lowers --.

Column 3,
Line 11, "pass" should read -- passes --;
Line 54, "convent ion al" should read -- conventional --.

Column 5,
Line 8, "short-circulated" should read -- short-circuited --;
Line 9, "the" should read -- of the --;
Line 15, "and" should read -- and been --.

Column 6,
Line 60, "stack" should read -- stacked --;
Line 66, "radials" should read -- radicals --.

Column 9,
Line 13, "thiodlpropionate" should read -- thiodipropionate --;
Line 16, "phosphate," should read -- phosphite, --.

Column 10,
Line 8, "is" should be deleted.

Column 14,
Line 35, "sliver" should read -- silver --.

UNITED STATES PATENT AND TRADEMARK OFFICE
CERTIFICATE OF CORRECTION

PATENT NO.   : 6,414,236 B1
DATED        : July 2, 2002
INVENTOR(S)  : Ichiro Kataoka et al.

It is certified that error appears in the above-identified patent and that said Letters Patent is hereby corrected as shown below:

Column 20,
Line 1, "nodule" should read -- module --.

Signed and Sealed this

Fourth Day of March, 2003

JAMES E. ROGAN
*Director of the United States Patent and Trademark Office*